United States Patent

Chen

[11] Patent Number: 5,962,197
[45] Date of Patent: Oct. 5, 1999

[54] ALKALINE ORGANIC PHOTORESIST STRIPPER

[75] Inventor: Zhao Chen, Tempe, Ariz.

[73] Assignee: Analyze Inc., Chandler, Ariz.

[21] Appl. No.: 09/049,294

[22] Filed: Mar. 27, 1998

[51] Int. Cl.[6] .................. G03C 5/00; B08B 7/00
[52] U.S. Cl. .................. 430/331; 430/329; 134/38
[58] Field of Search .................. 430/329, 331; 134/38

[56] References Cited

U.S. PATENT DOCUMENTS

| | | | |
|---|---|---|---|
| 3,924,455 | 12/1975 | Bergishagen et al. | 73/88 |
| 4,744,834 | 5/1988 | Haq | 134/38 |
| 4,765,844 | 8/1988 | Merrem et al. | 134/38 |
| 4,992,108 | 2/1991 | Ward et al. | 134/38 |
| 5,290,365 | 3/1994 | Whitton | 134/38 |
| 5,472,830 | 12/1995 | Honda | 430/331 |
| 5,529,887 | 6/1996 | Horn et al. | 430/331 |
| 5,597,678 | 1/1997 | Honda et al. | 430/331 |

*Primary Examiner*—John A. McPherson
*Assistant Examiner*—Rosemary Ashton
*Attorney, Agent, or Firm*—Fennemore Craig

[57] ABSTRACT

A stripper for removing photoresist or solder masks has a composition of 30–80% by weight of a propylene glycol ether; 10–60% by weight of a pyrrolidone; 0.1–5% by weight of potassium hydroxide; 0.1–10% by weight of a surfactant; 0–20% by weight 1,3-butanediol; 0–10% by weight 2-(2-aminoethoxy) ethanol; and a water content of <1%.

9 Claims, No Drawings

ALKALINE ORGANIC PHOTORESIST STRIPPER

BACKGROUND OF THE INVENTION

This invention relates to an alkaline based stripper for adherent organic layers and, in particular, to a composition including propylene glycol ether compounds and potassium hydroxide for stripping photoresist.

In the manufacture of semiconductor wafers, and other applications, a layer of metal, semiconductor, or insulator is coated with photoresist. The photoresist is exposed to actinic radiation and then etched in a suitable etchant to produce a pattern in the photoresist. The remaining photoresist protects selected areas of the underlying layer while exposed areas are treated. After treatment, the remaining photoresist must be removed.

Photoresist is chemically altered by exposure to actinic radiation. Specifically, after radiation, the photoresist no longer etches uniformly and the more easily etched material is removed to produce a pattern. Thus, by definition, the material that remains on the layer is more difficult to etch. In principle, one can easily remove any photoresist with a variety of strippers. The problem is that one wants to remove only the photoresist and not etch or corrupt any other material or leave any residue of either the stripper or the photoresist.

A semiconductor wafer may include on one surface thereof exposed silicon, oxides and nitrides of silicon or a metal, and one or more metals, such as copper, aluminum, tungsten, nickel, and gold. A printed circuit board includes many of the same materials. It is difficult to find a stripper that is selective, i.e. that strips or removes photoresist without attacking another part of a processed wafer or a printed circuit board. Obviously, at some level of magnification, a stripper can be shown to have corroded an exposed aluminum layer, for example. What is desired is a minimum level of corrosion, below which further processing is unaffected and the electrical operation of the product is unaffected.

It is known in the art to include a hydroxide in a stripper for photoresist. In aqueous solution, a hydroxide is too vigorous for use as a stripper because many or most of the above-identified materials on a wafer are also attacked by the hydroxide. Several strippers have been developed in which a hydroxide is used in an organic solvent. For example, U.S. Pat. No. 4,744,834 (Haq) discloses a mixture including quaternary ammonium hydroxide, diethylene glycol monoalkyl ether, polyglycol, and 2-pyrrolidone. U.S. Pat. No. 5,529,887 (Horn et al.) discloses a stripper for removing cured photoresist or a cured solder mask. The stripper includes an alkali hydroxide, such as sodium hydroxide, potassium hydroxide, or quaternary ammonium hydroxide, a glycol monoalkyl ether having two to six carbon atoms, and a water soluble fluoride.

Solder masks differ from photoresist masks in at least two respects. A photoresist mask is typically one or two microns thick, whereas a solder mask is typically several microns or tens of microns thick. In addition, a solder mask is exposed to heat after curing; e.g. immersing a circuit board in a solder bath. The subsequent heating further hardens the mask, particularly if the solder mask is heat curable. For these reasons, a solder mask is more difficult to remove than a photoresist mask.

Ethylene glycol monoalkyl ether solutions containing potassium hydroxide and co-solvents effectively remove photoresists and other organic materials, such as residues from solder operations. Unfortunately, ethylene glycol ethers are classified as hazardous air pollutants by the U.S. Government, requiring expensive equipment and procedures for handling and disposal. Further, the most effective ethylene glycol ethers have low boiling points and low flash points. A wafer is typically stripped in a solution at a temperature of 90–110° C., near the boiling point and above the flash point of many ethylene glycol ethers. Thus, strippers based upon this solvent produce volatile organic compounds that must be contained and that pose a fire hazard at operating temperatures. Finally, the most effective of this group of solvents, ethylene glycol monomethyl ether, is known to be highly toxic to human beings.

In view of the foregoing, it is therefore an object of the invention to provide an alkaline organic stripper containing or producing no known hazardous air pollutants.

Another object of the invention is to provide an alkaline organic stripper that does not use solvents known to be toxic to human beings.

A further object of the invention is to provide an alkaline organic stripper having a high flash point (>110° C.)

Another object of the invention is to provide an alkaline organic stripper having a high boiling point (>150° C.).

A further object of the invention is to provide an alkaline organic stripper that is highly selective.

Another object of the invention is to provide an alkaline organic stripper producing less volatile organic compounds than strippers of the prior art.

A further object of the invention is to provide an alkaline organic stripper that can remove photoresist masks and solder masks.

SUMMARY OF THE INVENTION

The foregoing objects are achieved in this invention in which a stripper for removing photoresist has a composition of 30–80% by weight of a propylene glycol ether; 10–60% by weight of a pyrrolidone; 0.1–5% by weight of potassium hydroxide; 0.1–10% by weight of a surfactant; 0–20% by weight 1,3-butanediol; 0–10% by weight 2-(2-aminoethoxy) ethanol; and a water content of <1% .

DETAILED DESCRIPTION OF THE INVENTION

A stripper formulated in accordance with the invention is based upon a propylene glycol ether and, preferably, propylene glycol phenyl ether. Propylene glycol ethers exhibit a different route of metabolism from ethylene glycol ethers and have been found to be minimally toxic. A propylene glycol ether is the major component of the stripper.

Potassium hydroxide is a minor component, by weight, of the stripper but is the most chemically active. It has been found that the amount of water in the stripper should be minimal, e.g. less than 1% by weight and preferably less than 0.50% by weight. As understood by those skilled in the art, the percentage of water in KOH is very difficult to measure directly due to the [OH—] ion in the KOH. In implementing the invention, the percentage of water was a calculated value from other experimental data rather than a measured value. KOH pellets as received from the manufacturer typically have a water content of about 15%, which is removed by heating a solution of KOH in propylene glycol ether under dry nitrogen to a temperature of approximately 105° C.–120° C. The solution is kept under dry nitrogen prior to combining with other organic solvents to avoid adsorbing water. Other techniques to assure low water content can be used instead.

Other components of the stripper include a pyrrolidone, diol, amino-alcohol, and a surfactant. In particular, a stripper formulated in accordance with the invention has the following composition.

TABLE I

| propylene glycol ether | 30–80% by weight |
| a pyrrolidone | 10–60% by weight |
| 1,3-butanediol | 0–20% by weight |
| potassium hydroxide | 0.1–5% by weight |
| surfactant | 0.1–10% by weight |
| amino-alcohol | 0–10% by weight |

A preferred embodiment of the invention has the following composition.

EXAMPLE 1

| propylene glycol phenyl ether | 62.3% by weight |
| N-(2-hydroxyethyl)-2-pyrrolidone | 29.0% by weight |
| 1,3 -butanediol | 1.0% by weight |
| potassium hydroxide | 1.7% by weight |
| Nonoxynol-9 | 5.0% by weight |
| 2-(2-aminoethoxy)ethanol | 1.0% by weight |

In Example 1, samples (wafer fragments having an area of approximately nine square inches) were immersed in the composition at a temperature of 105° C. for forty minutes. The potassium hydroxide is believed to hydrolyze ester cross-linked sites in the photoresist, causing the resist to swell and fragment. The stripper reacts at the boundary between the photoresist and the underlying layer to release the photoresist, which comes off as softened flakes from the layer. The softened flakes are slowly broken down by the stripper.

The butanediol (1,3-dihydroxybutane, 1,3-butylene glycol) provides a stronger stripping action or higher stripping power to remove organic residues. When fresh, the stripper has a pH of approximately 13, which decreases with usage. The aminoethoxyethanol helps maintain a high pH (>11) and provides a stronger stripping action to remove solder residue. The Nonoxynol-9 (poly(oxy-1,2-ethanediyl), α-nonylphenyl-ω-hydroxy) is a surfactant.

After treatment, the samples were rinsed in a solution of a surfactant and a solvent (tripropylene glycol ether) and then rinsed in de-ionized water. The samples showed complete removal of photoresist, no residue, and essentially no corrosion of any exposed metal.

Additional examples of the invention include the following compositions in which samples were treated as described above.

EXAMPLE 2

| propylene glycol phenyl ether | 62.0% by weight |
| 2-pyrrolidone | 31.0% by weight |
| surfactant* | 5.0% by weight |
| potassium hydroxide | 2.0% by weight |

EXAMPLE 3

| propylene glycol n-propyl ether | 63.0% by weight |
| 2-pyrrolidone | 31.0% by weight |
| surfactant* | 5.0% by weight |
| potassium hydroxide | 1.0% by weight |

EXAMPLE 4

| propylene glycol n-propyl ether | 62.5% by weight |
| N-methyl-2-pyrrolidone | 31.0% by weight |
| surfactant* | 5.0% by weight |
| potassium hydroxide | 1.5% by weight |

EXAMPLE 5

| propylene glycol methyl ether | 63.0% by weight |
| N-methyl-2-pyrrolidone | 32.0% by weight |
| surfactant* | 4.0% by weight |
| potassium hydroxide | 1.0% by weight |

EXAMPLE 6

| propylene glycol methyl ether | 63.0% by weight |
| 2-pyrrolidone | 32.0% by weight |
| surfactant* | 4.0% by weight |
| potassium hydroxide | 1.0% by weight |

*The surfactant used in Examples 2–6 was poly(oxy-1,2-ethanediyl), α-nonylphenyl-ω-hydroxy. Other surfactants with alkali stable linkages can be used instead. One can add small amounts of 1,3-butanediol or an amino-alcohol to the compositions of Examples 2–6 but the compositions work well without either additive.

Examples 2, 3, and 6 do not strip as selectively as Example 1 but corrode copper slightly. Even so, the strippers are useful. Examples 5 and 6 have relatively low boiling points (≈120° C.) but are useful at low temperatures for some applications. Some strippers of the prior art, based upon ethylene glycol ethers, may have a boiling point that is the same or higher than the boiling points of the propylene glycol ethers but the strippers of the prior art contain hazardous air pollutants.

The invention thus provides an alkaline organic stripper containing or producing no known hazardous air pollutants and having low toxicity. The stripper has a high flash point (>110° C.) and a high boiling point (>150° C.), producing less volatile organic compounds than strippers of the prior art. The stripper is highly selective and can remove photoresist masks and solder masks.

Having thus described the invention, it will be apparent to those skilled in the art that various modifications can be made within the scope of the invention. For example, one can substitute sodium hydroxide or quaternary ammonium hydroxide for potassium hydroxide and substitute 2-amino-ethanol for aminoethoxyethanol. Other diols that can be used include those of the formula HO—R—OH, wherein R is a 3–6 carbon alkyl group. The choice and amount of pyrrolidone is a question of chemistry, cost, and availability. Most pyrrolidories are believed effective, particularly in concentrations above 20–25 percent by weight. Below twenty percent by weight, some corrosion may occur. Some pyrrolidones are rather expensive, which tends to limit the amount used in the stripper to reduce the cost of the stripper. Pyrrolidones having the formula

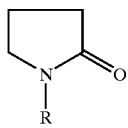

wherein

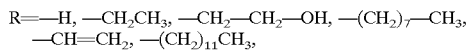

or

are suitable and these compounds are commercially available. Other pyrrolidones are also suitable, such a those wherein R=

—CH₂—CH₂—CH₃,

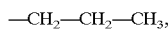

or

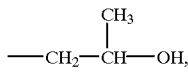

What is claimed as the invention is:

1. An alkaline-containing photoresist stripping composition comprising:
   a propylene glycol ether;
   a pyrrolidone;
   potassium hydroxide;
   a surfactant; and
   a water content of less than one percent.

2. The alkaline-containing photoresist stripping composition as set forth in claim 1 and further including an amine.

3. The alkaline-containing photoresist stripping composition as set forth in claim 2 wherein said amine is 2-(2-aminoethoxy)ethanol.

4. The alkaline-containing photoresist stripping composition as set forth in claim 1 and further including a butylene glycol.

5. The alkaline-containing photoresist stripping composition as set forth in claim 4 wherein said butylene glycol is 1,3-butanediol.

6. An alkaline-containing photoresist stripping composition comprising:

| propylene glycol ether | 30–80% by weight |
| --- | --- |
| N-alkyl-2-pyrrolidone | 10–60% by weight |
| potassium hydroxide | 0.1–5% by weight |
| surfactant | 0.1–10% by weight |
| amino-ethanol | 0–10% by weight | wherein said composition is characterized by a water content of less than one percent, and whereby said composition is able to remove photoresist in the presence of metal without substantially corroding the metal.

7. The alkaline-containing photoresist stripping composition as set forth in claim 6 wherein said composition comprises:
   approximately 60% by weight propylene glycol phenyl ether and approximately 30% by weight N-(2-hydroxyethyl)-2-pyrrolidone.

8. The alkaline-containing photoresist stripping composition as set forth in claim 6 wherein said composition comprises:
   approximately 60% by weight propylene glycol n-propyl ether and approximately 30% by weight 2-pyrrolidone.

9. The alkaline-containing photoresist stripping composition as set forth in claim 6 wherein said composition comprises:
   approximately 60% by weight propylene glycol n-propyl ether and approximately 30% by weight N-methyl-2-pyrrolidone.

* * * * *